United States Patent
Ochiai

(10) Patent No.: US 7,658,618 B2
(45) Date of Patent: Feb. 9, 2010

(54) ELECTRIC CONNECTOR

(75) Inventor: Toshimasa Ochiai, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 12/401,046

(22) Filed: Mar. 10, 2009

(65) Prior Publication Data

US 2009/0176398 A1     Jul. 9, 2009

Related U.S. Application Data

(63) Continuation of application No. PCT/JP2007/067289, filed on Sep. 5, 2007.

(30) Foreign Application Priority Data

Sep. 20, 2006  (JP)  ................ 2006-254911

(51) Int. Cl.
    *H01R 12/00*    (2006.01)
(52) U.S. Cl. .......................... 439/66; 439/71
(58) Field of Classification Search .................. 439/66, 439/71, 81, 65
    See application file for complete search history.

(56) References Cited

U.S. PATENT DOCUMENTS

| | | | |
|---|---|---|---|
| 6,293,808 B1 | 9/2001 | Ochiai | |
| 6,971,885 B2 | 12/2005 | Mowry | |
| 7,226,294 B2 * | 6/2007 | Shirai et al. | 439/66 |
| 7,258,550 B2 * | 8/2007 | Chen et al. | 439/66 |
| 7,263,770 B2 * | 9/2007 | Mendenhall et al. | 29/856 |
| 7,267,554 B2 * | 9/2007 | Huang | 439/73 |
| 2006/0024987 A1 | 2/2006 | Huang et al. | |

FOREIGN PATENT DOCUMENTS

| | | |
|---|---|---|
| JP | 06-223936 A1 | 8/1994 |
| JP | 2001-167857 A1 | 6/2001 |
| JP | 2006-049260 A1 | 2/2006 |

\* cited by examiner

*Primary Examiner*—Hien Vu
(74) *Attorney, Agent, or Firm*—Burr & Brown

(57) ABSTRACT

An electric connector provided with a plurality of connecting elements which electrically connect a first electrode group and a second electrode group opposite between two devices, wherein (a) first contact points in contact with electrodes of the first electrode group of the connecting elements correspond to intersection points on an a×b where a and b correspond to pitch size, and (b) second contact points in contact with electrodes of the second electrode group of the connecting elements form at least two groups.

19 Claims, 9 Drawing Sheets

(a)

(b)

(a)

Contact-to-contact pitch between first contact points : $\sqrt{[a^2 + (nb)^2]} = a$ $n=0$
$\tan\theta = 0$ (b)

$n=1$
$\tan\theta = nb/a$

Contact-to-contact pitch between first contact points :
$\sqrt{[a^2 + (nb)^2]} = \sqrt{[a^2 + b^2]}$ (c)

Contact-to-contact pitch between first contact points :
$\sqrt{[a^2 + (nb)^2]}$
$= \sqrt{[a^2 + (2b)^2]}$ $n=2$
$\tan\theta = nb/a$ (a)

(b)

ELECTRIC CONNECTOR

TECHNICAL FIELD

The present invention relates to an electric connector.

BACKGROUND ART

With the improved degree of semiconductor integration, there have recently been packages having arrayed electrodes, some of which have a class of 5000 pins. In many cases, array-type packages are soldered directly to a printed circuit board, as BGA (ball grid array). However, because of thermal stress cracking of solder on large packages, and demands of replacement and maintenance, there has been an increase in the use of the LGA (land grid array) method using a pressure-connected socket. For example, sizes of LGA packages have become large and electrode gap has been narrowed, so that electric connectors such as LGA sockets in response to this trend are demanded.

Furthermore, when wafer sizes are increased to 300 mm to 400 mm in diameter in view of productivity improvement of semiconductors, the number of electrodes to be simultaneously inspected is markedly increased to several thousands to several tens of thousands of pins. Therefore, electric connectors such as probes in semiconductor inspection apparatuses must be further narrowed in pitch in response to the thus enlarged wafers. On the other hand, because of the increased number of product types and the like, also, inspection apparatuses are requested which can be used by replacing only an electric connector of a wafer-side probe.

A connecting element of a thin-type LGA socket is used to connect such flat electrodes with each other, cantilever types are mainly used because of their spring characteristic, electric property and cost. As cantilever connectors require a certain length of a beam in an oblique rising direction to satisfy requirements of displacement and load, an array method of connecting elements has been developed as a response to the narrowed pitch.

Furthermore, a cantilever connector is characterized in that stable electric connection is obtained by breaking an oxide layer on a surface, while the end of a connecting element slides on a device electrode. However, when beams are oriented in the same direction in the case of super-multi-pins, a total sliding force is increased, which generates a large reaction between a device and a connector. In particular, when the base material portion of a connector is a film-like elastic body, sometimes the base material portion becomes undulated or transforms, which sometimes damages stable connection.

To solve such a problem, a method is disclosed in which the beam directions are opposite every two lines to totally balance the sliding force (patent documents 1, 2, 3, and the like).

Patent document 1: Specification, U.S. Pat. No. 6,293,808

Patent document 2: Specification, U.S. Pat. No. 6,971,885

Patent document 3: Bulletin, Japanese Unexamined Patent Application Publication No. 2006-49260

DISCLOSURE OF INVENTION

However, the methods disclosed by the patent documents 1 and 2 are limited to a case in which an array direction of beams is parallel or inclined by 45° with respect to the outer side of a support, and the beam array direction is not disclosed otherwise. Furthermore, in any of these patent documents, it is presupposed that the contact point of an upper contact 1 and a lower contact 2 is at a same position and that upper and lower devices have a same electrode pattern.

On the other hand, the patent document 3 discloses a diagram in which contacts which are inclined by 45° with respect to the outer side of a support are opposite, not on every two columns but by dividing into sections, and furthermore the upper and lower contact points are not at a same point. However, this method does not disclose an array configuration which enables to obtain a beam length in a case when a pitch becomes narrower than the beam length. Furthermore, when beams are formed in block by MEMS (Micro Electro Mechanical System), the direction of materials is limited, which may sometimes result in damaged characteristics and yield.

Therefore, the present invention has an objective of providing an electric connector having a connecting element array configuration, which enables to obtain characteristics required for a cantilever connector of which pitch is equivalent to existing one in terms of mechanical characteristics and electric characteristics, even if the pitch becomes narrower. Furthermore, the present invention has another objective of providing an electric connector having an array configuration, which enables to avoid or control generation of defects to the electric connector, caused by sliding force resulting from an increased number of pins. Furthermore, the present invention has further another objective of providing an electric connector having a connecting element array configuration, which enables to effectively array a connecting element.

The inventors, after reviewing the above-described problems to solve, have completed the present invention, by finding an array configuration, which enables to obtain characteristics required for the connecting element, based on array information of contact points in contact with device electrodes, information concerning a beam length required for a connecting element, and the like, thus controlling sliding force. Furthermore, by using such array configuration, it was found that connecting elements having favorable characteristics can be manufactured, and then the present invention was completed. In other words, according to the present invention, the following means are presented.

In the present invention, an electric connector provided with a plurality of connecting elements electrically connecting a first electrode group and a second electrode group which are opposite each other between two devices, wherein:

(a) first contact points of the connecting elements, in contact with electrodes of the first electrode group correspond to intersection points on an a×b grid where a and b correspond to pitch size, (b) second contact points of the connecting elements, in contact with electrodes of the second electrode group form at least two groups, and in two adjoining groups, while the respective connecting elements are arrayed opposite each other to the other group, the second contact points of the connecting elements which are arrayed directly opposite each other along the array direction of the connecting elements are arrayed at intervals of distance expressed by the following expression (1)

$$(2c+1)\sqrt{a^2+(nb)^2)}, \quad (1)$$

where n is an integer of 0 or more, c is the ratio of a difference of the distance between the first contact point and the second contact point of the connecting element, to the distance between the first contact points (contact-to-contact pitch) along the array direction of the connecting element.

Furthermore, in an electric connector according to the present invention, furthermore, (c) the connecting element may be arrayed at an angle θ, which is expressed by the following expression (2), with respect to any of the grid lines composing the grid. In this case, in the expression (2), preferably, n is 1 or more.

$$\tan \theta = nb/a \qquad (2)$$

(where, n is an integer of 0 or more)

Furthermore, in an electric connector, (d) the grid lines composing the grid, may be at the angle θ, with respect to any of the outer sides of the connecting element array area. In this case, in the expression (2), preferably, n is one or more.

The electric connector according to this aspect of the invention, the second contact points of the connecting elements may correspond to intersection points different from the intersection points of the grid to which the first contact points of the connecting elements correspond. Furthermore, a boundary line dividing the two groups of the second contact of the connecting elements may be nearly parallel to any of the grid lines composing the grid, may be nearly parallel to a diagonal of the grid, and may be at an angle θ expressed by the above-mentioned expression (2), with respect to any of the grid lines composing the grid. Preferably, n is an integer of 1 or more in the expression (2).

Furthermore, in the electric connector according to the present invention, the grid lines composing the grid, may be at an angle θ, which is expressed by the above-described expression (2) with respect to any of the outer sides composing a contour of the formed area of the first contact points. In this electric connector, it is preferable that n≧1, 0.2≦c≦4. Furthermore, in this electric connector, the angle θ is preferably 25° or more and 65° or less. Furthermore, preferably, a=b at the same time.

In the electric connector of the present invention, a support supporting the connecting element is an elastic body.

In the electric connector of the present invention, the connecting element provided with a tabular beam which is in contact with the first contact point and the second contact point, and the tabular thickness of which conforms to a spring thickness. Preferably, the tabular beam is configured in such a manner that, when load in contact with the first electrode group and the second electrode group is applied, a stress thereon becomes a tensile stress on one surface, and a compressive stress on the other surface.

BEST MODES FOR CARRYING OUT THE INVENTION

An electric connector according to the present invention is an electric connector provided with a plurality of connecting elements electrically connecting a first electrode group and a second electrode group which are opposite between two devices, wherein:

(a) First contact points in contact with electrodes of the afore-mentioned first electrode group correspond to intersection points in a×b grids where a and b correspond to pitch size, (b) Second contact points in contact with electrodes of the second electrode group of the connecting elements form at least two groups. While, in two adjoining groups, each of the connecting elements is arrayed opposite to ones in the other group, in the two adjoining groups, the second contact points of the connecting elements which are arrayed directly opposite along the array direction of the connecting elements, are arrayed with a distance expressed by the above-described expression (1).

In an electric connector according to the present invention, beams orients the intersection points on the grids having a pitch size of a×b, as the first contact points, in an array of connecting elements, two or more groups of the second connecting points is provided with a intervals of distance expressed by the above-described expression (1), which enables to obtain an electric connector, in which defects to the electric connector caused by reaction and the like due to sliding force can be avoided or controlled. Furthermore, by performing an array at an angle θ expressed by the above-described expression (2), it is possible to obtain an array configuration of connecting elements which can secure the mechanical characteristics (displacement, spring load, high-temperature characteristics, etc) and electric characteristics (conductor resistance, high frequency characteristic) which are equivalent to conventional ones. Hence, by the electric connector according to the present invention, easy conformability to narrowed pitch and multi-pin tendency can be achieved.

The embodiments according to the present invention will be explained in detail below with reference to the drawings.

(Electric Connector)

Figure 1:
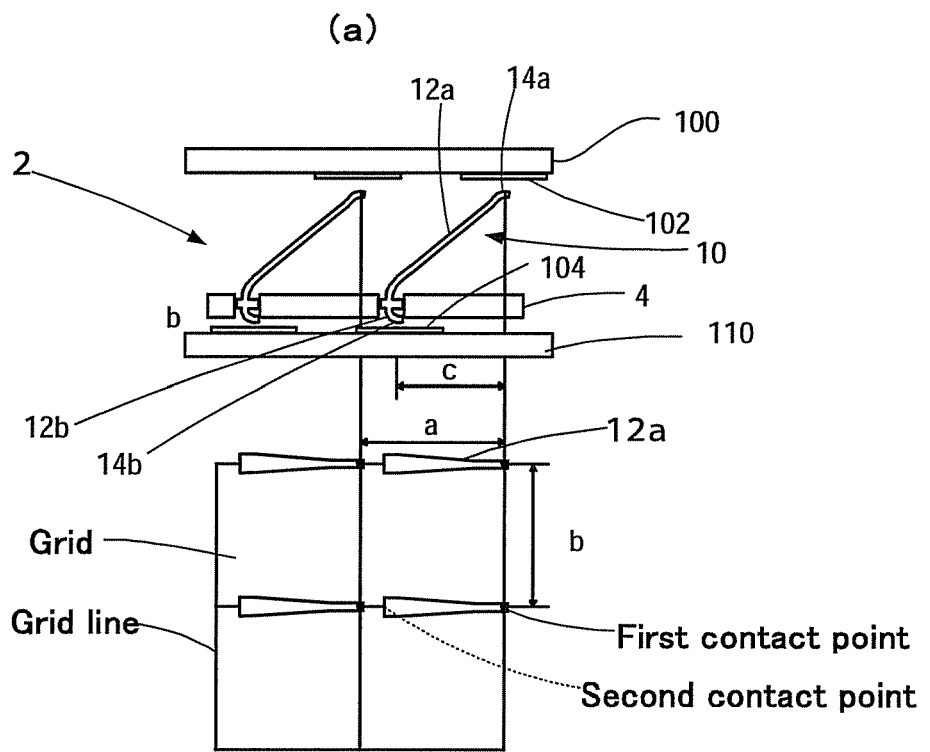
FIG. 1 A diagram (a) showing a relation between a connecting element and an electrode, and a diagram (b) showing an array of electrodes, according to the present invention.
Figure 1:
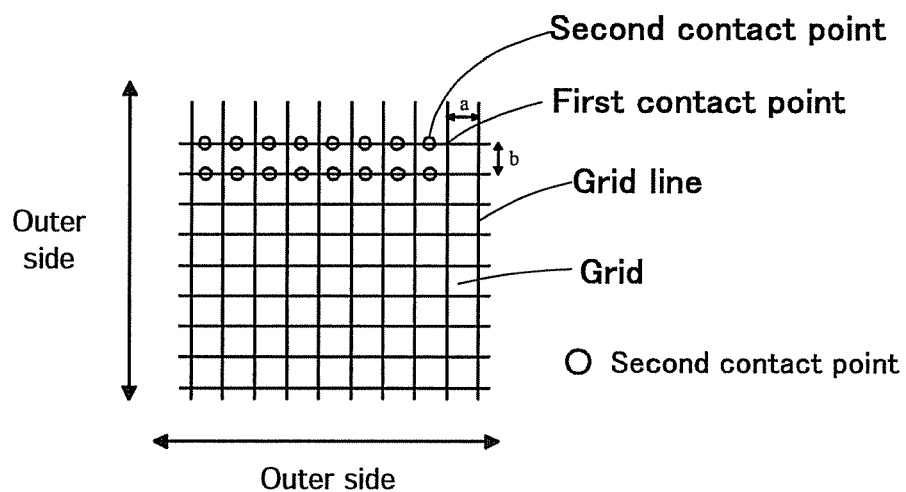

FIG. 1 (a) shows a relation between a partial configuration of an example of an electric connector 2 of the present invention and devices 100 and 110. The electric connector 2 includes a support 4 and a connecting element 10, and the connecting element 10 is retained in many configurations by the support 4.

(Connecting Element)

The shape of the connecting element 10 is not limited particularly. It may be provided with the contacts 12a and 12b having the contact points 14a and 14b at the ends which can be in contact with the electrodes 102 and 104 of the opposite devices 100 and 110, or may have the contacts 12a and 12b as a separate connecting element, respectively. Both or either of the contacts 12a and 12b may be in a shape of a cantilever or in various shapes of buckling springs. However, to locate the end of a buckling spring, it will be necessary to provide a new guide plate, and a shape of a cantilever is preferred when considering the quantity of displacement and the degree of freedom of setting contact load.

Although the cantilever element is not especially limited, for example, as indicated in FIG. 1 (a), it may be provided with a beam shaped contact 12a having a contact point with an electrode of a device located upward at its end, and with a contact 12b having a contact point with an electrode of a device located downward, or may be provided with beam form contacts at upper and lower positions. If required, the contact points 14a and 14b may be provided with a solder ball.

The contacts 12a and 12b may be a tabular beam or wire shaped beam, but preferably are a tabular beam in view of reducing conductor resistance. Furthermore, the contacts 12a and 12b are more preferably a tabular beam with a thickness equivalent to the thickness of a spring. With such a tabular beam, it is possible to easily obtain high strength and large displacement. Furthermore, the tabular contacts 12a and 12b, when they are subjected to a load in such a manner that they contact with a device electrode, preferably, have a configuration in which stress becomes tensile stress on one side of the plate, and compressive stress on the other side. In other words, at the time of contact with an electrode, the contacts 12a and 12b are preferably configured to be bent only toward one side in the direction of the tabular thickness of the contacts 12a and 12b of the tabular beams, respectively. By such tabular contacts 12a and 12b, displacement is adjusted by changing the length of the contacts 12a and 12b, but according to the present invention, the contact length of the tabular contacts 12a and 12b can be easily adjusted with a pitch interval smaller than the contact length.

Furthermore, it is preferably that such tabular contact is formed in such a manner that the connecting element 10 tapers from the central thereof to the end thereof. By narrowing the beam width, it is possible to provide large displacement while keeping the surface stress of the connecting element 10 uniform in the lengthwise direction of the contacts 12a and 12b. The tabular cantilever can be obtained by processing to obtain a predetermined shape by punching out a flat plate or partial removal by etching.

The contacts 12a and 12b of the connecting element 10, when they are made of rolled metal material, preferably have the same lengthwise orientation as the rolling direction of the rolled metal material. Thereby, favorable spring characteristics can be obtained.

An object of the present invention is to realize cantilever connectors having different contact lengths. In the case of the connecting elements 10, because the contact point position of both contacts is complicated, it has been difficult to realize an array of the connecting elements 10. However, by applying the present invention, it is therefore possible to easily realize an array of the connecting elements 10.

Examples of the materials composing the connecting elements 10 include, but are not especially limited to copper beryllium, copper titanate, an alloy of copper, nickel and tin, an alloy of copper, nickel and silicon, and nickel beryllium. Among other factors, it is preferable to use copper beryllium from the viewpoint of electrical conductivity and durability. In this regard, the surface of such materials may be gold-plated after base plating.

(Support)

Without especially limiting the support 4 supporting the connecting element 10, various types of heretofore known supports can be used. Examples of the materials composing the support 4 of the electric connector 2 include, but are not especially limited to, glass-fiber-containing epoxy resin such as FR4, engineering plastics such as polyether ether ketone (PEEK) and several kinds of ceramics. In particular, in the electric connector 2 according to the present invention, the support 4 is preferably a elastic body. If it is a elastic body, the support 4 moves (between planes) by itself when force is applied to the contact, following the surface of an opposing device, and thereby favorable conductivity can be obtained without applying to the contact more load than required.

(Array of Connecting Elements)

Next, description will be given of the array of the connecting elements 10 in the electric connector 2.

(Array of First Contact Points)

As shown in FIG. 1 (b), in the electric connector 2 of the present invention, either of the first contact point 14a and the second contact point 14b of the contacts 12a and 12b in contact with the opposing electrode 102 preferably corresponds to an intersection point on a grid having a pitch size of a×b. The grid, in this context, is a geometric pattern consisting of quadrate partitions periodically arranged. The quadrate partitions may be square or rectangular. The grid may be perpendicular to or inclined with respect to at least one outer side of the support 4, or at least one outer side of the array area of the connecting elements 10. In this regard, the outer side of the array area of the connecting elements 10 is a contour connecting the outermost contact point 14a or contact point 14b of the contact points 14a or the contact points 14b of the arrayed connecting element 10. Description will be made below regarding a case where a grid is perpendicular to at least one outer side of the support 4, or to at least one outer side of an array area of the connecting elements 10.

In other words, the intersection points on the grid correspond to the positions of the electrodes 102. By selecting an intersection point on the grid as the contact point 14a, it is possible to easily determine the direction of the contact 12a of the connecting element 10. Preferably, the contact points 14a and 14b of the connecting element 10 correspond to intersection points on the grid, respectively, and are designed to be in contact with the electrodes 102 and 104 at the corresponding intersection points.

The pitch size and the like of the grid are not especially limited. Ordinarily, the pitch size is 0.5 mm or more and 2.5 mm or less. A preferable pitch size to be applied in the present invention is 0.65 mm or more and 1.27 mm or less. This is because, thus far, it has been difficult to effectively array cantilever connectors. More preferably, the pitch size is 0.65 mm or more and 1.0 mm or less. Furthermore, the ratio of a to b in pitch size may be freely selected, but it is advantageous when a=b because it is easy to determine an electrode position.

Meanwhile, the grid position of the contact point 14a (electrode 102) and the grid position of the contact point 14b (electrode 104) correspond to each other in many cases. However, in a narrow-pitch and multi-pin case, cases of positional conformity are limited even if pitch sizes conform to each other when beam directions are opposite. In many cases, the positions of the electrode 102 and the electrode 104, namely, the first contact point 14a and the second contact point 14b are different (offset) between the devices 100 and 110, which are opposite. A case when the intersection points of the first contact point 14a and the second contact point 14b limitedly superpose partially (substantially conform) between the devices is, to be described later, when intervals of distance between the directly opposite second contact points 14b, where two opposite second contact point groups are directly opposite, becomes an integral multiple of the contact-to-contact pitch. Furthermore, when c is 0.2 or less, the electrode position of the electrode 102 and the electrode position of the electrode 104 are substantially the same.

(Array Direction of Connecting Elements)

When deciding an array of the connecting elements 10, it is preferable to select as its standard a contact which is the most difficult to array. For example, as shown in FIG. 1 (a), when the connecting elements 10 are provided with two contacts 12a and 12b, it is preferable to determine the array direction of the connecting elements 10, using the longer contact 12a as a standard. A description will be given below of how to determine the array direction of connecting element 10, on the basis of the length and the like of the longer contact 12a.

The connecting elements 10 can be arrayed in such a manner that the contact point 14a of the contact 12a will reach an intersection point on the grid. The connecting elements 10 may be arrayed in such a manner that the contact 12a of the connecting element 10 will be placed along a grid line composing the grid (grid line in the direction of the pitch a, or grid line in the direction of pitch b), or may be arrayed so that it will be inclined with respect to a grid line. In particular, with an increased demand for narrower pitches and more pins, when long beams are required, it is preferable that the contact 12a of the connecting element 10 will not be parallel with a grid line, but will be inclined so that the contact point 14a thereof will reach an intersection point on a grid. Thereby, it is possible to obtain a substantially long contact-to-contact pitch.

For this purpose, in the above-mentioned expression (2), by properly setting n for setting angle θ, it is possible to array the connecting element 10 with an inclination angle θ with respect to a grid. Thereby, it is possible to obtain a larger first contact-to-contact pitch (hereinafter called simply "contact-to-contact pitch") along a direction of the contact 12 of the connecting element 10, without changing the grid pitch (a or b) which is set as the distance between electrodes (contacts).

Figure 2:
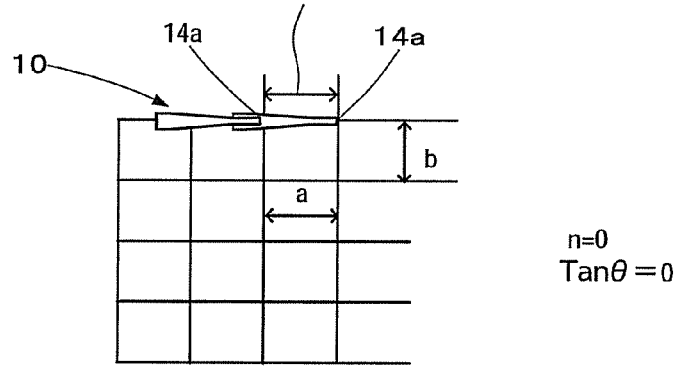
FIG. 2 Diagrams (a) to (c) showing examples in which connecting elements are arrayed with grids inclined in respect to grid lines.
Figure 2:
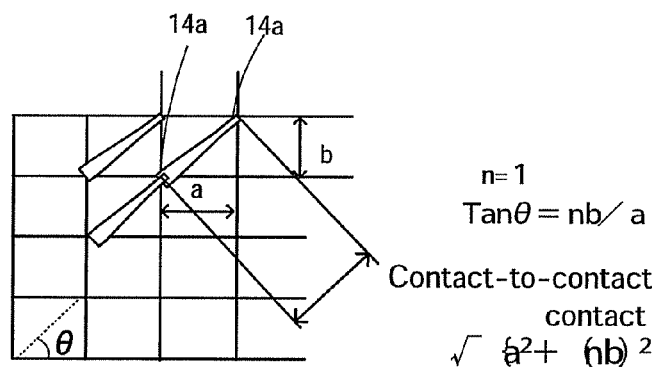
Figure 2:
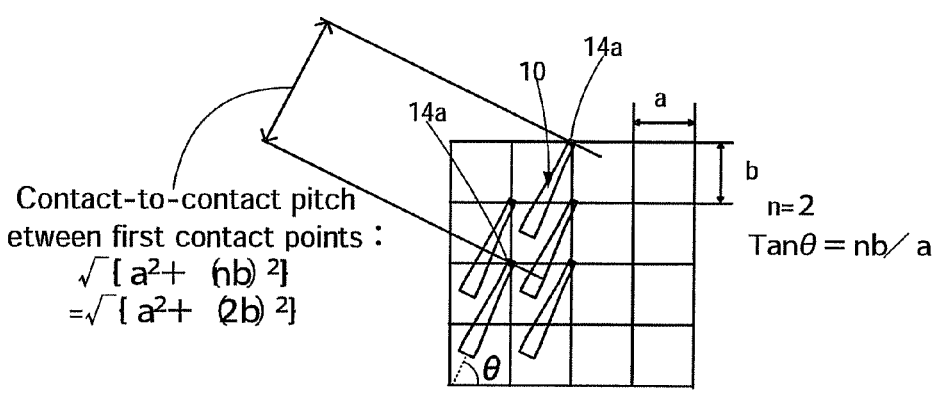

A description will be given below of a case where the connecting element 10 is inclined with respect to the grid line along the pitch a. As shown in FIG. 2(a), when n is an integer equal to or more than 0, the distance between contacts in the case where the inclination is made at an angle θ in the above-mentioned expression (2) is expressed as ($\sqrt{(a^2+(nb)^2)}$). Therefore, when n=0, the contact-to-contact pitch ($\sqrt{(a^2+(nb)^2)}$) is a and is the same as the grid pitch a. However, as shown in FIG. 2(b), when n=1, the contact-to-contact pitch is the length of a grid diagonal ($\sqrt{(a^2+b^2)}$). Furthermore, as shown in FIG. 2(c), when n=2, the contact-to-contact pitch is a diagonal ($\sqrt{(a^2+(2b)^2)}$) extending across two adjacent grids squares. Thus, by obtaining an actual contact-to-contact pitch larger than a grid pitch, which is a in this case, by inclining the connecting element 10, it is possible to realize an array, by controlling mutual interference of long beams. With array of long beams without interference, it is possible to array the connecting elements 10, regardless of the increased tendency toward smaller pitches and increased pin number.

In this regard, whether n is appropriate, namely, the angle θ or a contact-to-contact pitch is appropriate for the connecting element 10 can be judged by confirming whether a contact-to-contact pitch is longer than a predetermined length of the contact 12a of the connecting element 10, or is sufficient to make the most of the characteristics of the contact 12a.

(Array of Second Contact Points)

In the present invention, as described above, it is possible to determine an array direction of the connecting element 10 so that the contact point 14a of the contact 12a will reach the intersection point on the grid and to determine an array such that sliding force will be offset when the connecting elements 10 are in contact with the electrodes 102 and 104. In other words, preferably, the connecting elements 10 which are arrayed in a predetermined array direction, are arrayed on the support 4 by laying them out in two or more groups so that the contact 12a will be opposite. Specifically, the connecting elements 10 constituting the two adjacent groups are arrayed in such a manner that the contact point 14a of the contact 12a is oriented in the same direction in each group, and is opposite to the contact point 14a of the contact 12a of the connecting element included in the other group.

Two or more groups which are arrayed opposite each other are preferably arrayed in such a manner that a boundary line (center line) of two groups which are arrayed opposite each other, will be the center of a formed area of the connecting element 10 on the support 4. Thereby, sliding force is offset effectively. The boundary line may be one which divides the formed area of the connecting element 10 into upper and lower halves, or right and left halves, or oblique halves.

Figure 3:
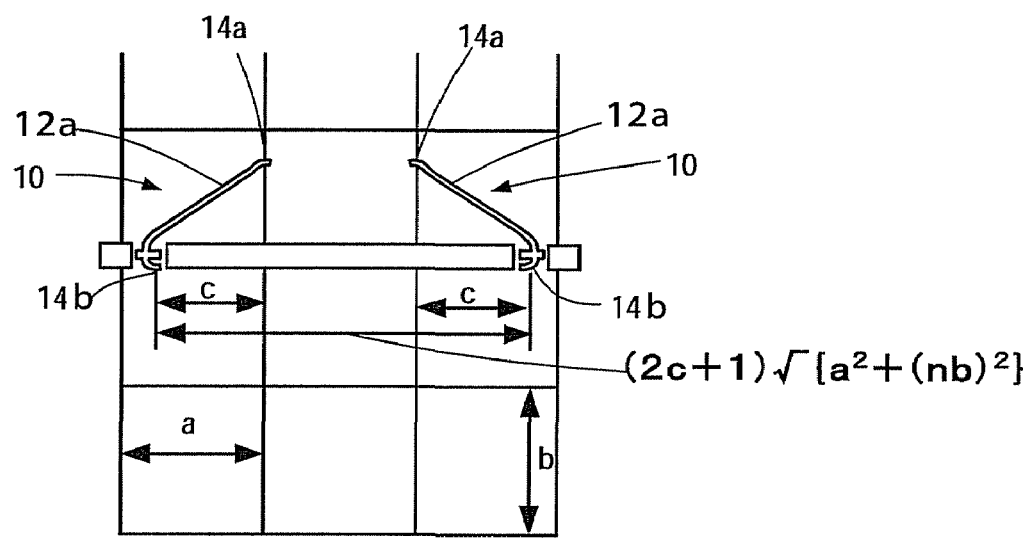
FIG. 3 A diagram showing a distance between second contact points in a second contact point group.

Furthermore, as shown in FIG. 3, in the two groups which are arrayed opposite each other, a second contact point 14b in the connecting element 10 which is directly opposite on the same axis along the array direction (extension direction of the contact 12a) of the connecting elements 10 is preferably separated by a distance more than a distance calculated by the following expression (1)

$$(2c+1)\sqrt{(a^2+(nb)^2)} \tag{1}$$

where n is an integer of 0 or more, c is the ratio of the distance between the first contact point and second contact point of the connecting element to the distance between the first contact points (contact-to-contact pitch) along the array direction of the connecting element.

When the second contact points 14b of two connecting elements 10 which are thus located opposite each other are separated by the distance, mutual interference between the contacts 12a of the connecting element 10 can be avoided, and then sliding force can be offset effectively. In this regard, for n in the above-mentioned expression (1), a value is introduced, which is the same as "n" in an angle θ calculating expression to determine an array direction of the connecting element 10. Furthermore, as shown in FIG. 1(a) and FIG. 3, the distance between the first contact point and second contact point is the length of the contact 12a minus the length of the contact 12b, and is equivalent to a protrusion length of the contact 12a. Therefore, c can be said to be a ratio of protrusion length (contact protrusion coefficient) of the contact 12a to the contact-to-contact pitch.

Thus, the array of the connecting element 10 is determined by the array direction of the connecting element 10, location of the group of the second contact points which are located opposite, and intervals of distance thereof. Examples of location of the two groups which are located opposite are given in FIG. 4 to FIG. 7.

Figure 4:
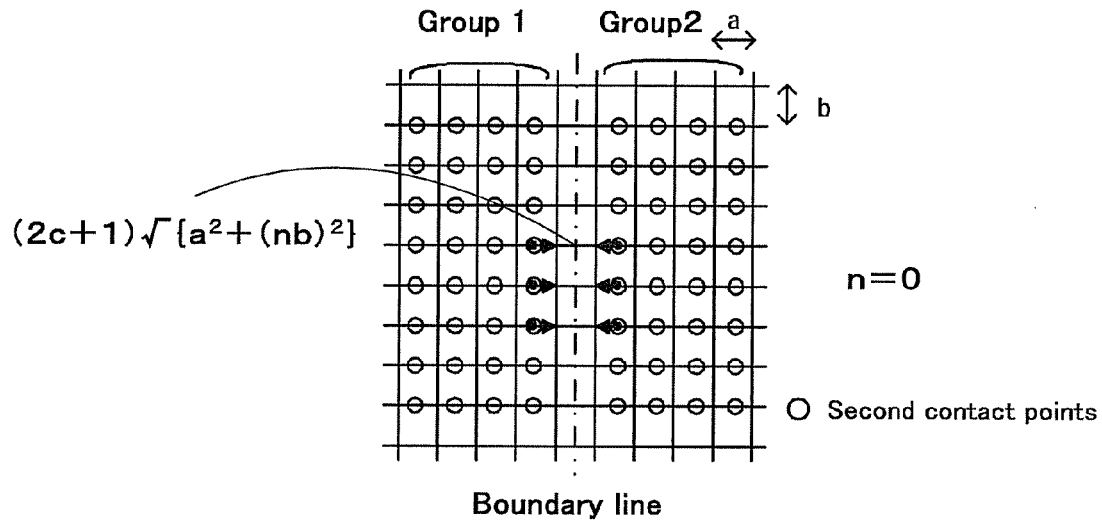
FIG. 4 A diagram showing an example of array of first contact points and second contact points.

FIG. 4 is an example in which the array direction of the connecting element 10 is n=0, that is, parallel to the direction of the pitch a, with c=approx. 0.5, and two groups are located in such boundary line of the two groups which are located opposite will be parallel to either of the grid lines composing a grid (here, grid lines in a direction of the pitch b).

Figure 5:
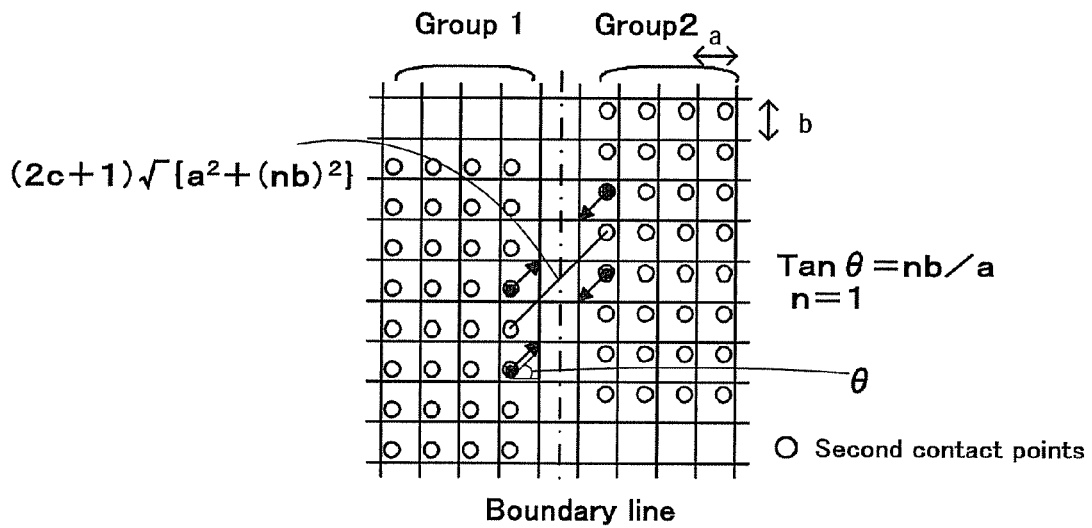
FIG. 5 A diagram showing an example of array of first contact points and second contact points.

FIG. 5 is an example in which the array direction of the connecting element 10 is n=1, that is, parallel to a diagonal direction of the grid, with c=approx. 0.7, two groups are located in such the boundary line of the two groups which are located opposite will be parallel to either of the grid lines composing a grid (here, grid lines in the direction of the pitch b).

Figure 6:
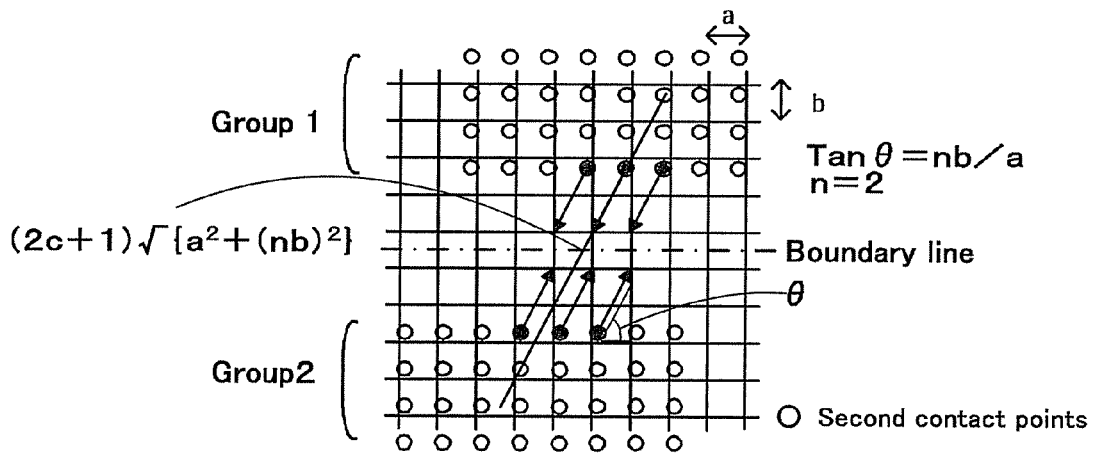
FIG. 6 A diagram showing an example of array of first contact points and second contact points.

FIG. 6 is an example in which the array direction of the connecting element 10 is n=2, that is, parallel to the direction of diagonals for two grids, with c=approx. 1.8, and two groups are located in such the boundary line of the two groups which are located opposite will be parallel to either of the grid lines composing a grid (here, grid lines in the direction of the pitch a).

Figure 7:
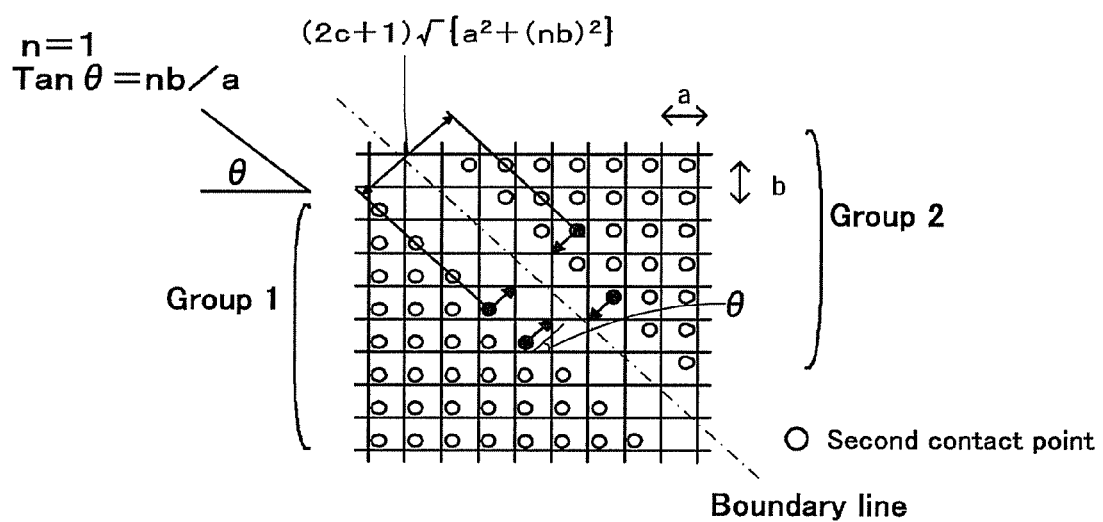
FIG. 7 A diagram showing an example of array of first contact points and second contact points.

FIG. 7 is an example in which the array direction of the connecting element 10 is n=1, that is, parallel to the diagonal direction of the grid, with c=approx. 0.8, and two groups are located in such boundary line of the two groups which are located opposite will be parallel to the diagonal of the grid.

Furthermore, the boundary line may be inclined to the grid line such it will be parallel to a line forming an angle θ to the grid line, expressed by the above-mentioned expression (2). In this case, n is preferably equal to 1 or more, and more preferably is equal to 2 or more. When n is 2 or more, the connecting element 10 can be located easily. Furthermore, in any of the array examples, second contact points which are directly opposite on a same axis of two opposite groups is separated with a distance more than a distance calculated by the above-described expression (1).

When determining an array of the connecting element 10, as described above, it is preferable that n=0 in the expressions (1) and (2), and that c≧1 in the expression (1). Thereby, it is possible not only to keep the characteristics of the conventional beams, but also to facilitate assembly thereof, even if a pitch is narrow.

Furthermore, when determining an array of the connecting element 10, as n=1 in the expressions (1) and (2), it is preferable that 0.2≦c≦0.9 in the expression (1). Thereby, it is possible to array a beam longer than a pitch, also in the MEMS method.

Furthermore, when determining an array of the connecting element 10, in the expressions (1) and (2), as n≧2, it is preferable that 0.2≦c≦0.9 in the expression (1). Thereby, it is possible to array a beam longer than a pitch, also in the MEMS method.

Furthermore, when determining an array of the connecting element 10, it is preferable that c≧1 in the expression (1). By applying the present invention, it is possible to easily enable a contact having long beam length of c=1 or more, to conform to a trend of narrowed pitch and increased pins.

(Oblique Grid)

When determining an array of the connecting elements 10, a grid may be arranged in correspondence with a contact point and electrode. In other words, by using an oblique grid for at least one outer side of the support 4 or for at least one outer side of an array area of the connecting element 10, it is possible to realize an array direction of the connecting element 10 of an electric connector 2, in a form adequate for manufacturing thereof.

Figure 8:
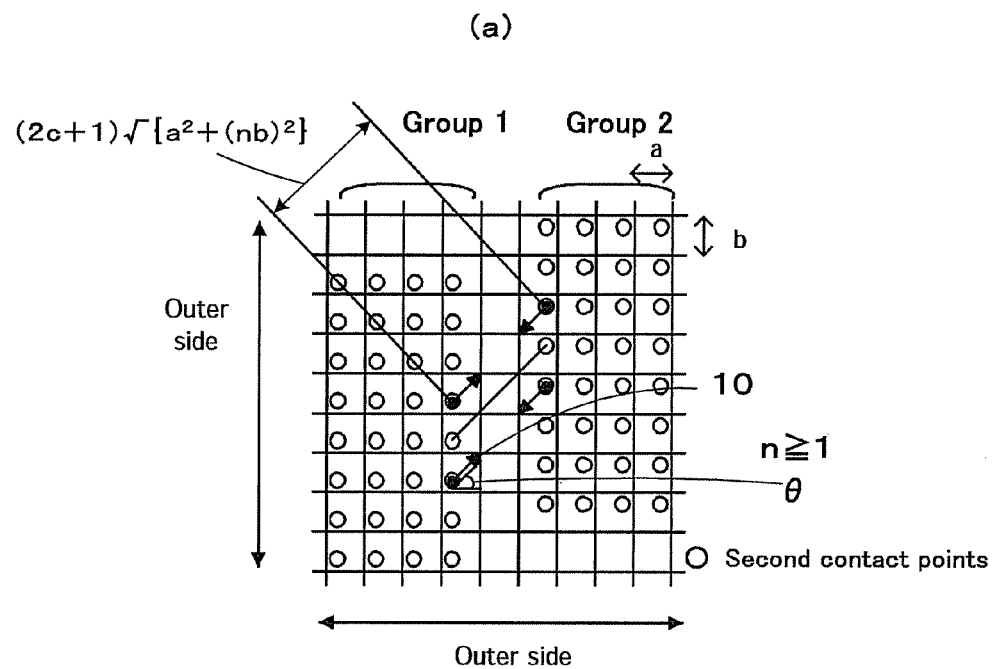
FIG. 8 A diagram showing an example of array of first contact points and second contact points with angle change of grids.
Figure 8:
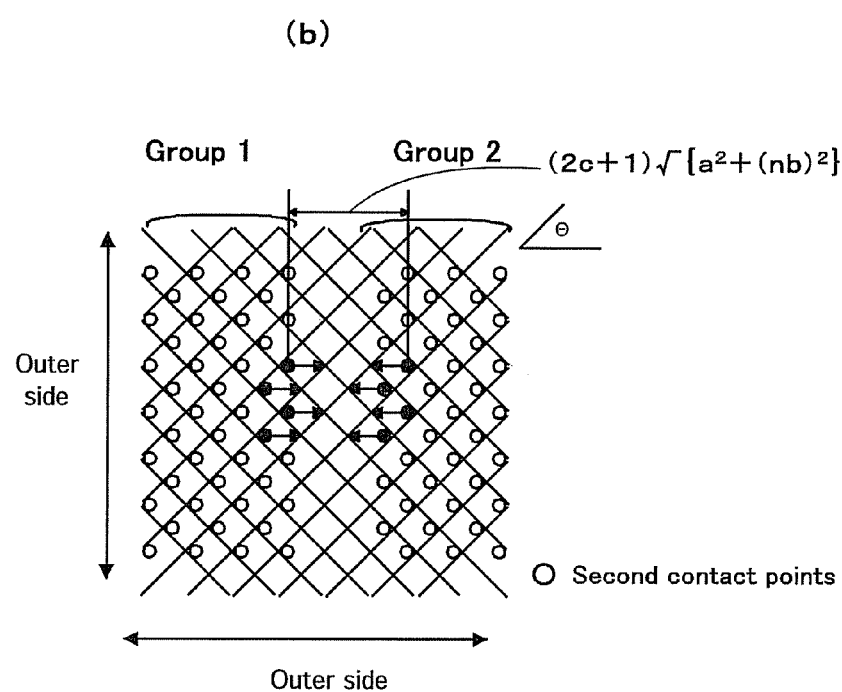

For example, as shown in FIG. 8(a), when n is an integer of 1 or more as a base to determine an array direction of the connecting element 10, the connecting element 10 is arrayed with an inclination of an angle θ to a grid line. In this case, as shown in FIG. 8(b), by using a grid previously rotated by an angle θ to the outer side, when it is inclined by an angle θ to the grid, the array direction of the connecting element 10 can be parallel to the outer side. Thereby, the array of the connecting element 10 on the electric connector 2 does not become complicated, and it is possible to easily take out a material for a connecting element. Furthermore, it is advantageous when the array direction of the connecting element 10 is required to consider directional characteristics of a material, such as conformity thereof with metal rolling direction.

Then, in the above-described expression (2), it is preferable that 0.2≦c≦4. For a thus wide range of contact protrusion coefficient c, the use of a thus inclined grid is effective. Furthermore, inclination of the grid is preferably with an angle θ of 35° or more to 55° or less. With this range of inclination, easy processing and assembly thereof are available. In this regard, also in an array of the connecting element 10, accompanied with such grid angle change, as described above, it is possible to obtain a favorable array of the connecting element 10 by determining array of the second contact points.

Description will be below given concretely with reference to embodiments of the present invention, not limitedly to the following embodiments.

FIRST EMBODIMENT

In this embodiment, description will be given of a process of determining an array configuration of the connecting elements 10, while arranging first contact points 14a of the connecting elements 10 having a predetermined length on intersection points on a grid having a pitch size of a×b (a=b=1.27 mm), by determining an array of second contact points 14b.

Figure 9:
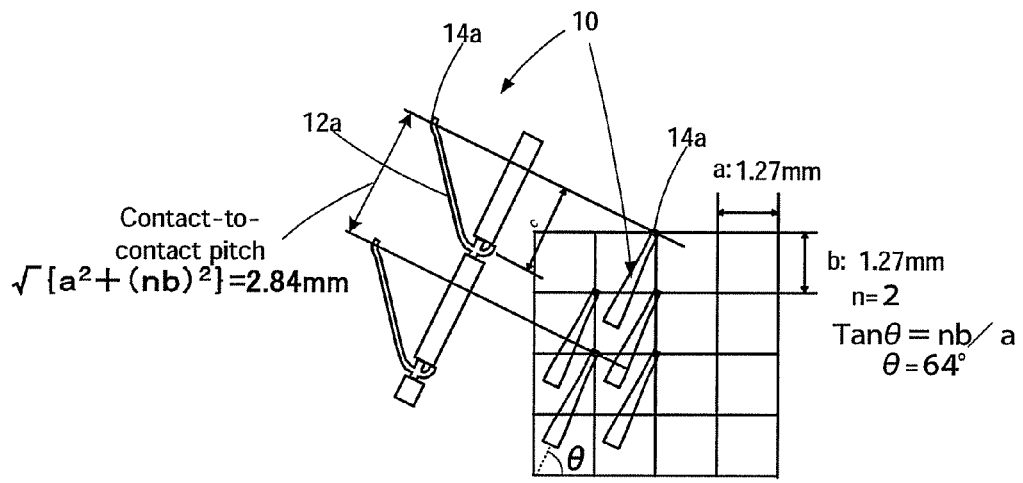
FIG. 9 An explanatory diagram about array direction of connecting elements in an embodiment 1.

First, an array direction (inclination) of the contact 12a of the connecting element 10 was determined. In this embodiment, it is supposed that the connecting element 10 having a contact 12a of 2.0 mm is arrayed. Therefore, a contact-to-contact distance is preferably 2 mm or more. Here, in this embodiment, as shown in FIG. 9, it is inclined by an angle θ when n=2, namely, approx. 64° (tan θ=nb/a n=2), with respect to a grid of 1.27 mm×1.27 mm. Thereby, the contact-to-contact distance is √(a²+(nb)²) (=approx. 2.84 mm). According to this result, a connecting element 10 having beam length of 2.0 mm is arrayed with inclination of 640 with respect to a grid. Thereby, because a sufficient pitch between second contacts can be obtained, array can be made without interference, even if the beam length is 2.0 mm. In this regard, being n=2, it has become possible to array a connecting element having a beam length of 2.0 mm, which cannot be arrayed at a pitch (approx. 1.80 mm) between first contact points in the 45°, which is an angle θ, being n=1. In this regard, when the connecting element having beam length of 2.0 mm is fixed in this direction, it becomes possible to obtain same spring characteristics as those obtained when a beam is fixed without inclining the connecting element at a pitch multiplied (2.54 mm) by an original pitch (1.27 mm).

Figure 10:
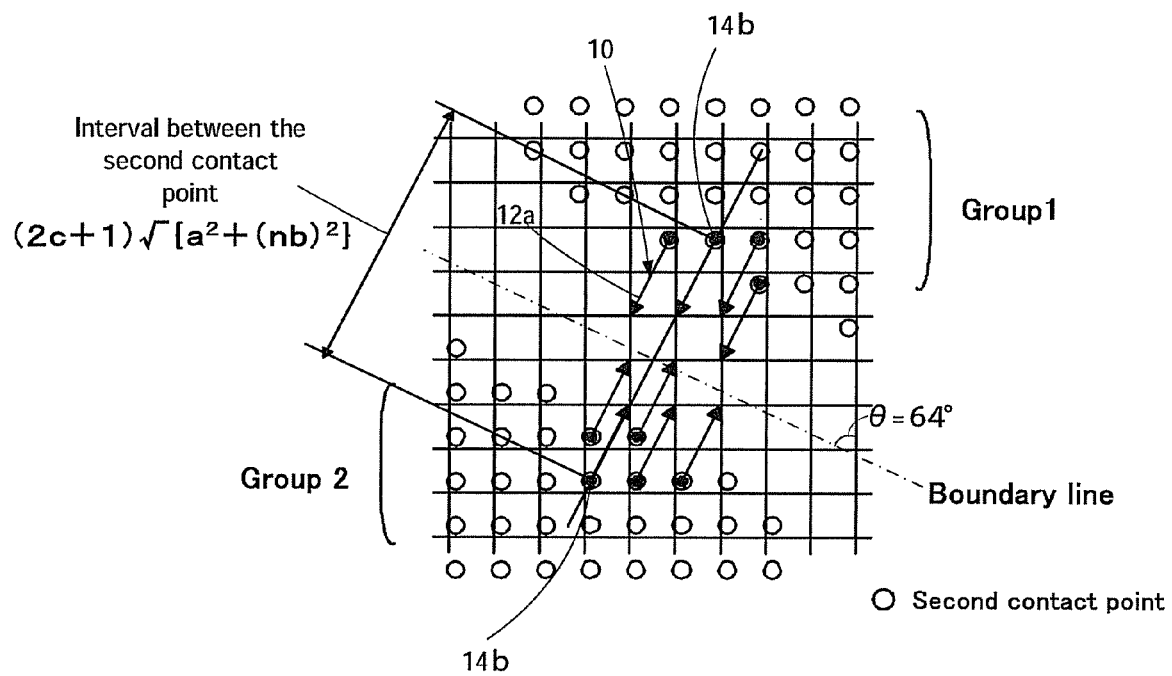
FIG. 10 A diagram showing an example of array of contact points in the embodiment 1.

Next, the array of second contact points 14b is determined. FIG. 10 shows an overall array configuration, in which an angle change is made for the connecting element 10, as described above. As shown in FIG. 10, second contact points 14b of the connecting elements 10 opposed in a same contact direction are separated by (2C+1)√(a²+(nb)²). When the protrusion coefficient C of the connecting element 10 is 0.8, if n=2, this distance 2.6×2.84=7.38 mm, which is about 2.6 times the contact-to-contact distance. Furthermore, when a contact protrusion coefficient C is 1, it becomes 3.0 times. When a separation distance is an integral multiple, an upper and lower grid points are overlapped, which has a merit that permits easy understanding of a design and manufacture thereof. Meanwhile, in this case, two columns are formed, in which there are not second contact points in a contact direction. Furthermore, two second contact point groups, which are separated with each other, are designed to halve contact point array areas nearly at their center.

While determining an array direction of contacts 12a so as to obtain a contact length permitting to have such required characteristics, by determining an array of second contact points, based on a distance required to array the connecting element 10 in an opposite way along the contact direction, it is possible to determine an array configuration adequate for connecting elements 10 to be used. Furthermore, by such array configuration, it is possible to make the most of characteristics of the connecting elements 10, and to effectively avoid defects due to sliding force.

SECOND EMBODIMENT

In this embodiment, description will be given of a process of determining an array configuration of the connecting elements 10, while arranging first contact points 14a of the connecting elements 10 having a predetermined length on intersection points on a grid having a pitch size of a×b (a=b=0.65 mm), by determining an array of second contact points 14b.

Figure 11:
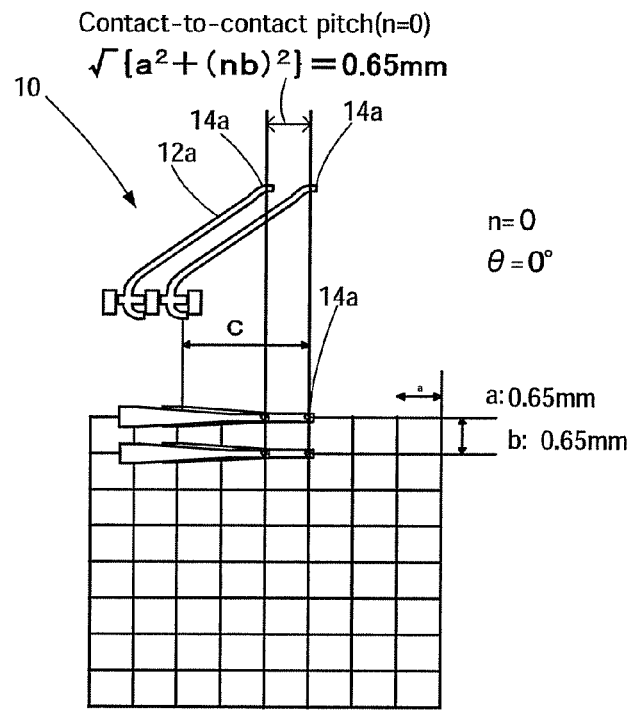
FIG. 11 An explanatory diagram about array direction of connecting elements in an embodiment 2.

First, a contact direction (inclination) of the connecting elements 10 is determined. In this embodiment, as shown in FIG. 11, the contacts 12a of the connecting elements 10 are arrayed such that 2.0 mm long contacts 12a will be overlapped, by having a contact-to-contact pitch as a grid pitch (0.65 mm), toward a horizontal direction (n=0, tan θ=nb/a), without inclination, along a grid line of the original grid line of 0.65 mm. Thereby, it is possible to have same spring characteristics as those used at 2.54 mm pitch, which are four times those of this embodiment.

Figure 12:
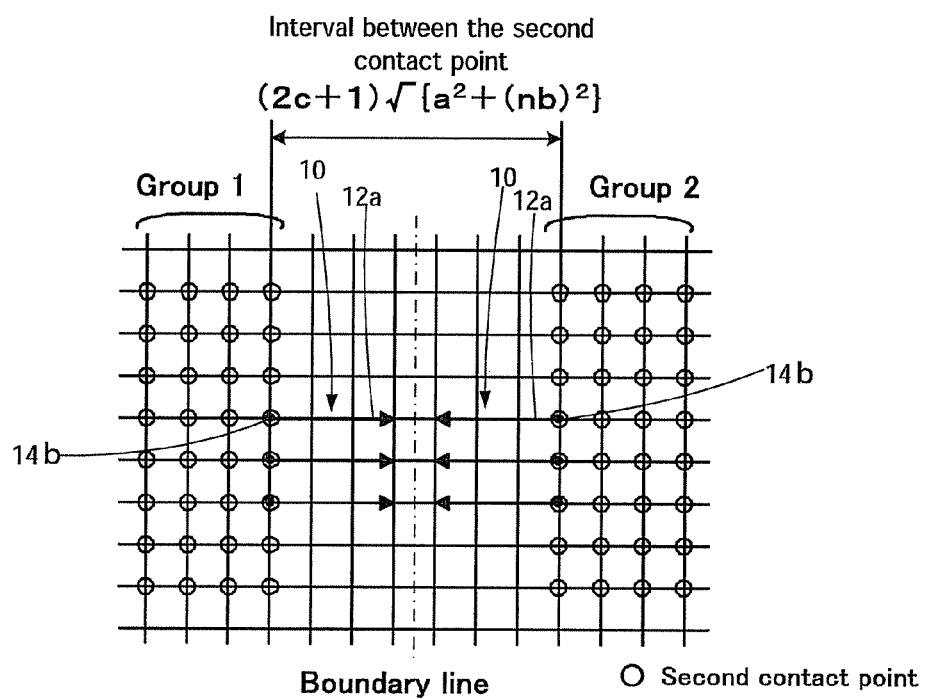
FIG. 12 A diagram showing an example of array of contact points in an embodiment 2.

Next, the array of second contact points 14b is determined. In FIG. 12, the second contact points 14b of the connecting elements 10 which are opposite in a beam direction, are designed to be separated by $(2C+1)\sqrt{(a^2+(nb)^2)}$ in a contact direction. When the contact protrusion coefficient C is 3, and n is 0, it is known that two second contact point groups should be formed in such that six columns of areas without second contact points will be provided for an area equivalent to seven pitches, namely, between the second contact points 14b of the directly opposite connecting elements 10. On the other hand, it is known that a device to be in contact with this connecting element 10 is required to have an electrode at such array. Furthermore, two second contact point groups, which are separated, are designed to halve a contact point array area nearly at a center thereof.

Thus, according to this embodiment, when the first contact points can obtain favorable spring characteristics in correspondence with the intersection points of the grid, it is known that a favorable array configuration of the connecting element can be obtained by separating the second contact points at a predetermined distance according to the above-described expression (2).

THIRD EMBODIMENT

In this embodiment, description will be given of a process of determining an array configuration of the connecting elements 10, while arranging first contact points 14a of the connecting elements 10 having a predetermined length on intersection points on a grid having a pitch size of a×b (a=b=1.0 mm), by determining an array of second contact points 14b.

Figure 13:
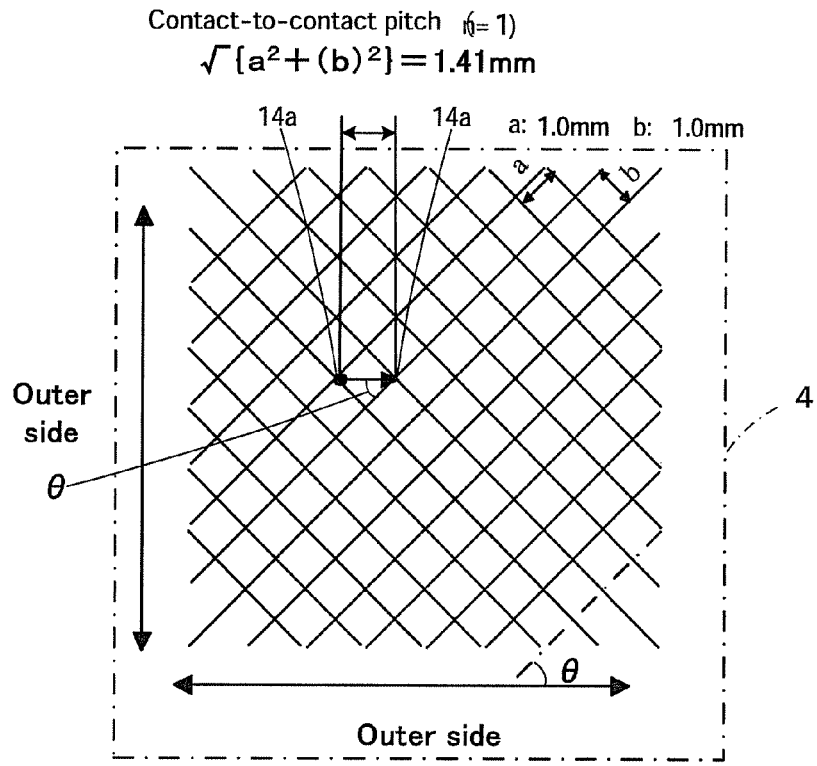
FIG. 13 An explanatory diagram about array direction of connecting elements in an embodiment 3.

First, a contact direction (inclination) of the connecting element 10 was determined. That is, in this embodiment, as shown in FIG. 13, a 1.0 mm-pitch grid, which is previously inclined by 45° with respect to a side of the support 4, is prepared. Such inclined grid may be formed, for example, by inclining grids consisting of the non-inclined first contact point groups, by 45° (n=1, tan θ=nb/a).

On the inclined grid, a contact direction which is inclined by 45° with respect to the grid line, is set, being n=1 in consideration of the contact length. Thereby, the contact-to-contact pitch is about 1.41 mm $\sqrt{(a^2+b^2)}$, as shown in FIG. 10. Furthermore, the contact 12a of the connecting element 10, inclined with respect to the grid line, is nearly parallel to the outer side of the support.

Figure 14:
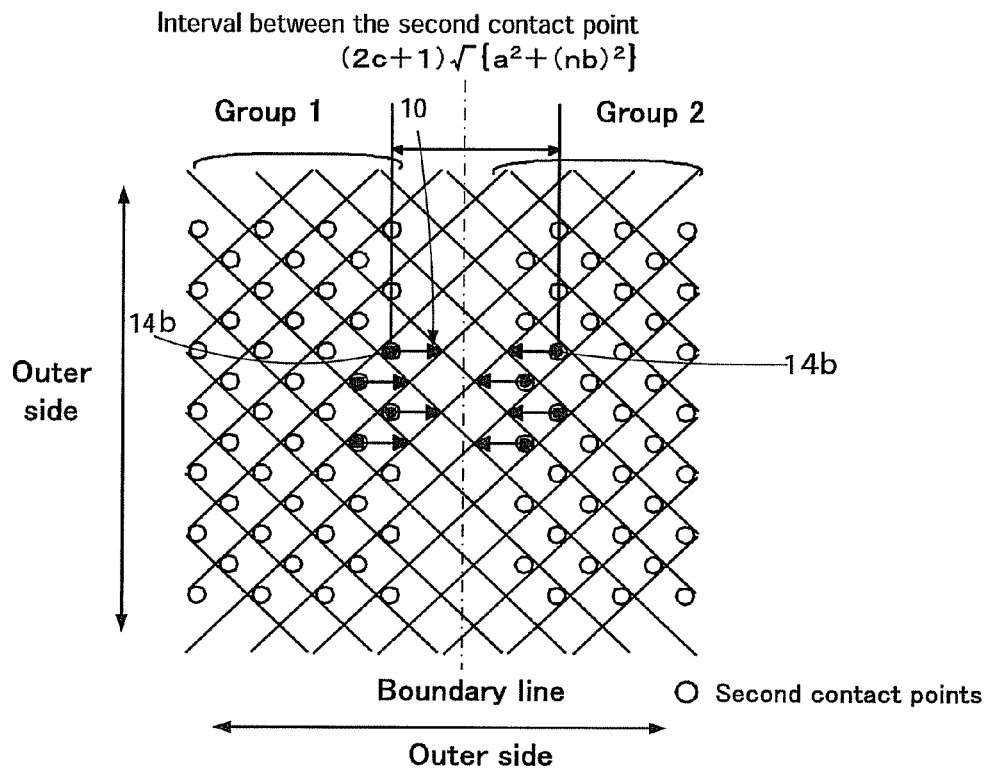
FIG. 14 A diagram showing an example of array of contact points in an embodiment 3.

Next, the array of second contact points 14b is determined. As shown in FIG. 14, connecting elements 10 which are opposed in a same contact direction are separated by $(2C+1)\sqrt{(a^2+(nb)^2)}$ in the oblique line of the grid. When the protrusion coefficient C of the connecting element 10 is 0.8, and n is 1, it has been known that, between the second connecting points of the directly opposite connecting element 10, separation is made so as to form a distance equivalent to about 3 pitches, namely, 2 columns of an area without second contact points 14b. Furthermore, two second contact point groups, which are separated, are designed to halve a contact point array area nearly at a center thereof.

According to this embodiment, by rotating a grid, if required, by a predetermined angle, not making the array direction of the connecting element 10 dependent on directional characters of the grid, it is possible to make the boundary area of the second contact point groups parallel to the side of a contact point forming area of an electric connector. Thereby, even when the contact 12a of the connecting element 10 is inclined by an angle θ with respect to the grid, it is possible to avoid that the second contact point groups will be obliquely opposite in the contact point forming area, and, as a result, the second contact point group-formed area has a deformed shape.

Furthermore, according to this embodiment, a processing pattern can be formed in such that many connecting elements 10 can be taken out effectively along a rolling direction. In general, a connecting element 10 forms a carrier composed of a connecting element material having a plurality of connecting elements 10 arrayed in a same direction. In view of manufacturing efficiency, preferably the carrier has a same number of connecting elements as is possible. However, for example, according to the connecting element array configuration shown in FIG. 7, eight types of carriers are required which have one to eight connecting elements, respectively. On the contrary, according to the connecting element array configuration shown in FIG. 14, it is enough to prepare two types of carriers which have 6 and 7 connecting elements 10, respectively, which results in improved yield. Furthermore, when a connecting element 10 is formed with a rolled metal material, preferably, a contact direction conforms to a rolling direction. In this case, according to the connecting element array configuration shown in FIG. 12, all connecting elements can be taken out from the rolled metal material along a rolling direction, which enables to obtain an electric connector having excellent durability of the connecting elements 10.

Meanwhile, in this embodiment, a case of n=1 is given. When n=2, as in the first embodiment, by inclining a grid by approx. 64° inclined by an angle θ (approx. 64°), it is possible to make the direction of a beam along a contact pitch horizontal to any of the sides in a contact point formed area.

As described above, according to the embodiments of the present invention, even when first contact points are arrayed in a shape of grid at small-pitched intervals, if required, by inclining a contact direction of a connecting element 10 to a grid, it is possible to array a connecting element having a long contact length, which enables to obtain reliability of a large-sized device, even if it is narrow-pitched. Furthermore, even if the number of pins is increased greatly, as a result of arraying oppositely the contact direction in a contact direction, sliding force is offset, which enables to secure stable contact without deformation of a support.

Meanwhile, according to these embodiments, by changing an array configuration of a connecting element 10, a location of a first contact point 14a and second contact point 14b, namely, a location of electrodes 102 and 104, it is possible to easily array, as a connecting element 10, also a cantilever connector on one side.

In these embodiments, two second contact point groups are configured, not limitedly to such configuration, and three or more second contact point groups may be configured. In all the second contact point groups, second contact points which are directly opposite, may be separated with a predetermined distance, and may have second contact point groups without such relation.

Meanwhile, as devices provided with such electric connectors according to the present invention, semiconductors provided with the electrodes arrayed in a shape of array (totally in a shape of array or area array), and IC chips are enumerated. Furthermore, as usages of the present invention, sockets and interposer to enable electric connection in such devices, and probe cards are enumerated. Furthermore, as electronic devices equipped with the electric connectors according to the present invention, ones equipped with IC chips are enumerated. For example, PCs and communication devices are comprised. Furthermore, inspection apparatuses for IC chips and semiconductors are enumerated, and, for example, semiconductor inspection devices and the like are enumerated.

Meanwhile, the present invention is not limited to the above-described embodiments, and is enforceable within a scope of the claims of the present invention. For example, the shape and number of bends which a fixed connecting element has, can be changed accordingly, and portions where a support is pinched in a connecting element, and portions where a support surface in contact with can be changed accordingly.

This application is based on the Japanese Patent Application No. 2006-254911 which was applied on Sep. 20, 2006, as claim of priority, and all the contents thereof are comprised by way of citation in the present specification.

INDUSTRIAL APPLICABILITY

The present application is applicable in an electronic industry, for example, of manufacturing semiconductor devices.

The invention claimed is:

1. An electric connector comprising a plurality of cantilever connecting elements each of said cantilever elements having different contact lengths extending outward from a support electrically connecting a first electrode group and a second electrode group which are opposite each other between two devices, wherein:
   (a) first contact points of the connecting elements in contact with an electrode of the first electrode group correspond to intersection points on an a×b grid where a and b correspond to pitch size,
   (b) second contact points of the connecting elements in contact with an electrode of the second electrode group form at least two groups, and in two adjoining groups, while the respective connecting elements are arrayed opposite each other to the other group, the second contact points of the connecting elements which are arrayed directly opposite each other along the array direction of the connecting elements are arrayed at intervals of distance expressed by the following expression (1)

$$(2c+1)\sqrt{(a^2+(nb)^2)}, \qquad (1)$$

where n is an integer of 0 or more, c is the ratio of a difference of the distance between the first contact point and the second contact point of the connecting element, to the distance between the first contact points (contact-to-contact pitch) along the array direction of the connecting element, and
   (c) a boundary line dividing the two groups is at an angle θ expressed by the following expression (2), with respect to any of the grid lines composing the grid $$\tan \theta = nb/a \qquad (2)$$

(where, n is an integer of 0 or more).

2. An electric connector according to claim 1, wherein each of the connecting elements is arrayed at an angle θ expressed by the following expression 2), with respect to any of the grid lines composing the grid $$\tan \theta = nb/a \qquad (2)$$

(where, n is an integer of 0 or more).

3. An electric connector according to claim 2, wherein n=0 and c≧1.

4. An electric connector according to claim 2, wherein n=1 and 0.2≦c≦0.9.

5. An electric connector according to claim 1, wherein n=0 and c≧1.

6. An electric connector according to claim 1, wherein n=1 and 0.2≦c≦0.9.

7. An electric connector according to claim 1, wherein n≧2 and 0.2≦c≦0.9.

8. An electric connector according to claim 1, wherein c≧1.

9. An electric connector according to claim 1, wherein n≧2.

10. An electric connector according to claim 1, wherein the second contact points of the connecting elements correspond to intersection points different from the intersection points of the grid to which the first contact points of the connecting elements correspond.

11. An electric connector according to claim 1, wherein a boundary line dividing the two groups is nearly parallel to any of the grid lines composing the grid.

12. An electric connector according to claim 1, wherein a boundary line dividing the two groups is nearly parallel to a diagonal of the grid.

13. An electric connector according to claim 2, wherein a grid line composing the grid is at an angle θ with respect to any of the outer sides of an array area of the connecting elements.

14. An electric connector according to claim 13, wherein n≧1 and 0.2≦c≦4.

15. An electric connector according to claim 13, wherein the angle θ is 25° or more, and 65° or less.

16. An electric connector according to claim 1, wherein a=b.

17. An electric connector according to claim 1, wherein the support supporting the connecting element is an elastic body.

18. An electric connector according to claim 1, wherein the connecting element provided with a tabular beam which is in contact with the first contact point and the second contact point, and the tabular thickness of which conforms to a spring thickness.

19. An electric connector according to claim 18, wherein the tabular beam is configured in such a manner that, when load in contact with the first electrode group and the second electrode group is applied, a stress thereon becomes a tensile stress on one surface, and a compressive stress on the other surface.

* * * * *